(12) United States Patent
Kuo et al.

(10) Patent No.: US 9,219,039 B2
(45) Date of Patent: Dec. 22, 2015

(54) INTERPOSER AND SEMICONDUCTOR PACKAGE WITH NOISE SUPPRESSION FEATURES

(71) Applicant: Taiwan Semiconductor Manufacturing Co., Ltd., Hsin-Chu (TW)

(72) Inventors: Feng-Wei Kuo, Zhudong Township (TW); Hui Yu Lee, Hsin-Chu (TW); Huan-Neng Chen, Taichung (TW); Yen-Jen Chen, Taipei (TW); Yu-Ling Lin, Taipei (TW); Chewn-Pu Jou, Chutung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/018,634

(22) Filed: Sep. 5, 2013

(65) Prior Publication Data
US 2014/0001609 A1  Jan. 2, 2014

Related U.S. Application Data

(62) Division of application No. 13/360,958, filed on Jan. 30, 2012, now abandoned.

(60) Provisional application No. 61/565,353, filed on Nov. 30, 2011.

(51) Int. Cl.
| | |
|---|---|
| *H01L 23/552* | (2006.01) |
| *H01L 23/538* | (2006.01) |
| *H01L 23/14* | (2006.01) |
| *H01L 23/00* | (2006.01) |
| *H01L 25/16* | (2006.01) |
| *H01L 23/498* | (2006.01) |

(Continued)

(52) U.S. Cl.
CPC ............ *H01L 23/552* (2013.01); *H01L 23/147* (2013.01); *H01L 23/49816* (2013.01); *H01L 23/5383* (2013.01); *H01L 23/5384* (2013.01); *H01L 24/13* (2013.01); *H01L 24/14* (2013.01); *H01L 23/3128* (2013.01); *H01L 23/642* (2013.01); *H01L 24/16* (2013.01); *H01L 25/0655* (2013.01); *H01L 2223/6677* (2013.01); *H01L 2224/131* (2013.01); *H01L 2224/14135* (2013.01); *H01L 2224/16225* (2013.01); *H01L 2924/14* (2013.01); *H01L 2924/1421* (2013.01); *H01L 2924/157* (2013.01); *H01L 2924/15192* (2013.01); *H01L 2924/15311* (2013.01); *H01L 2924/19042* (2013.01); *H01L 2924/19104* (2013.01)

(58) Field of Classification Search
None
See application file for complete search history.

(56) References Cited

U.S. PATENT DOCUMENTS

| | | | |
|---|---|---|---|
| 6,369,448 B1 | 4/2002 | McCormick | |
| 6,734,472 B2 | 5/2004 | Ho | |

(Continued)

*Primary Examiner* — Steven Loke
*Assistant Examiner* — Juanita B Rhodes
(74) *Attorney, Agent, or Firm* — Duane Morris LLP

(57) ABSTRACT

Interposer and semiconductor package embodiments provide for the isolation and suppression of electronic noise such as EM emissions in the semiconductor package. The interposer includes shield structures in various embodiments, the shield structures blocking the electrical noise from the noise source, from other electrical signals or devices. The shields include solid structures and some embodiments and decoupling capacitors in other embodiments. The coupling structures includes multiple rows of solder balls included in strips that couple the components and surround and contain the source of electrical noise.

11 Claims, 15 Drawing Sheets

(51) Int. Cl.
  *H01L 23/31* (2006.01)
  *H01L 23/64* (2006.01)
  *H01L 25/065* (2006.01)

(56) References Cited

U.S. PATENT DOCUMENTS

| | | | |
|---|---|---|---|
| 7,268,419 B2 | 9/2007 | Cornelius | |
| 7,566,960 B1* | 7/2009 | Conn | 257/686 |
| 7,777,324 B2 | 8/2010 | Kim et al. | |
| 2004/0184219 A1* | 9/2004 | Otsuka et al. | 361/306.3 |
| 2005/0213280 A1* | 9/2005 | Azrai et al. | 361/271 |
| 2005/0280146 A1* | 12/2005 | Cornelius | 257/730 |
| 2006/0012966 A1* | 1/2006 | Chakravorty | 361/763 |
| 2008/0067656 A1 | 3/2008 | Leung et al. | |
| 2008/0180878 A1* | 7/2008 | Wang et al. | 361/306.3 |
| 2009/0150848 A1 | 6/2009 | Alon et al. | |
| 2009/0200651 A1 | 8/2009 | Kung et al. | |
| 2011/0061913 A1 | 3/2011 | Higuchi et al. | |

* cited by examiner

US 9,219,039 B2

INTERPOSER AND SEMICONDUCTOR PACKAGE WITH NOISE SUPPRESSION FEATURES

RELATED APPLICATIONS

This application is a divisional of U.S. patent application Ser. No. 13/360,958, filed on Jan. 30, 2012, which claims the benefit of U.S. Provisional Patent Application No. 61/565,353, filed Nov. 30, 2011, the contents of which are incorporated by reference as if set forth in their entirety.

TECHNICAL FIELD

This disclosure relates to semiconductor device packages and their components.

BACKGROUND

Integrated circuits ("ICs") are incorporated into many electronic devices. IC packaging has evolved such that multiple ICs may be vertically stacked in so-called three-dimensional ("3D") packages in order to save horizontal area on a printed circuit board ("PCB"). An alternative packaging technique, referred to as a 2.5D package, may use an interposer, which may be formed from a semiconductor material such as silicon, for coupling one or more semiconductor die to a PCB. A plurality of IC or other semiconductor die which may be of heterogeneous technologies, may be mounted on the interposer. In addition to being joined to the plurality of IC die, the interposer is also joined to the PCB and oftentimes to a package substrate disposed between the PCB and the interposer.

Many devices on one or more of the semiconductor die may cause electrical noise and/or create electromagnetic ("EM") interference by emitting EM emissions. RF devices and inductors are examples of devices which can create electrical noise and electromagnetic ("EM") interference. The noisy source such as an RF transmitter or receiver generates electric noise in the form of EM emissions that can propagate through air, or electrical noise in signals carried in conductive structures such as metal leads. The EM emissions and the noisy electrical signals carried in the conductive leads, can impact various other signals and devices in the interposer, the other semiconductor die coupled to the interposer, and various components in all parts of the package. Noisy electrical signals and EM emissions therefore present serious problems in semiconductor packaging.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The embodiments of the disclosure provide interposer structures, package assemblies including interposers, and couplings between interposers and semiconductor die, designed to isolate electromagnetic emission and other electrical noise by shielding the electromagnetic emission and other electrical noise from other electrical signals.

Figure 1:
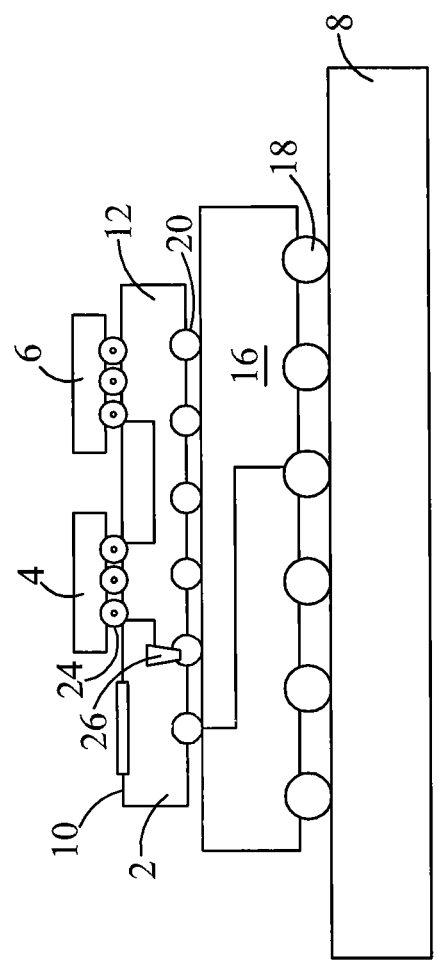
FIG. 1 is a side view of an embodiment of a package including an interposer.

FIG. 1 shows an embodiment of a semiconductor packaging arrangement. Interposer 2 is disposed between semiconductor die 4 and 6, and PCB (printed circuit board) 8. More particularly, semiconductor die 4 and 6 are joined to first surface 10 of interposer 2 and opposed second surface 12 of interposer 2 faces PCB 8 and is directly joined to package substrate 16.

Package substrate 16 is joined to PCB 8 by solder balls 18 and to interposer 2 by solder bumps 20 in the illustrated embodiment. Solder balls 24 join interposer 2 to semiconductor die 4 and 6. Solder balls are referred to broadly as such, but need not be completely "ball shaped" as in the illustrated embodiments. Solder balls are alternatively referred to as solder bumps and take on various shapes in various embodiments. Solder balls physically join the respective components together and electrically couple electronic features of the respective components together.

Solder balls 18 have a size of about 200-300 um in one embodiment and are BGA-type solder balls in one embodiment. A ball grid array (BGA) is a type of surface-mount packaging used for integrated circuits and BGA solder balls are the type and size of solder balls commonly used in BGA applications and are known in the art. Solder balls 18 are sized differently in other exemplary embodiments. Solder bumps 20 are about 50-150 um in diameter in one embodiment, but are sized differently in other exemplary embodiments. Interposer 2 may include through-silicon vias ("TSVs") that extend essentially from first surface 10 to second surface 12, although TSV's that extend completely through interposer 2 are not shown in the illustrated embodiment. TSV 26 is exemplary and extends from solder bump 20 to an electrical lead coupled to solder bump 24. This configuration is also exemplary. The layout shown in FIG. 1 is intended to be exemplary only and to illustrate an embodiment of an interposer included within a package that also includes PCB 8 and semiconductor die 4 and 6. In other embodiments, package substrate 16 is not used, and in other embodiments, additional semiconductor die and other components are coupled to interposer 2.

The various interposer embodiments described herein may be utilized in the exemplary package arrangement setting of FIG. 1 or in various other arrangements.

In one embodiment, interposer 2 includes a substrate body made of silicon. In another embodiment, interposer 2 includes a substrate body made of silicon-glass or other suitable materials commonly used in the semiconductor art. Interposer 2 includes a thickness suitable to meet the requirements of the specific packaging application intended.

Figure 2:
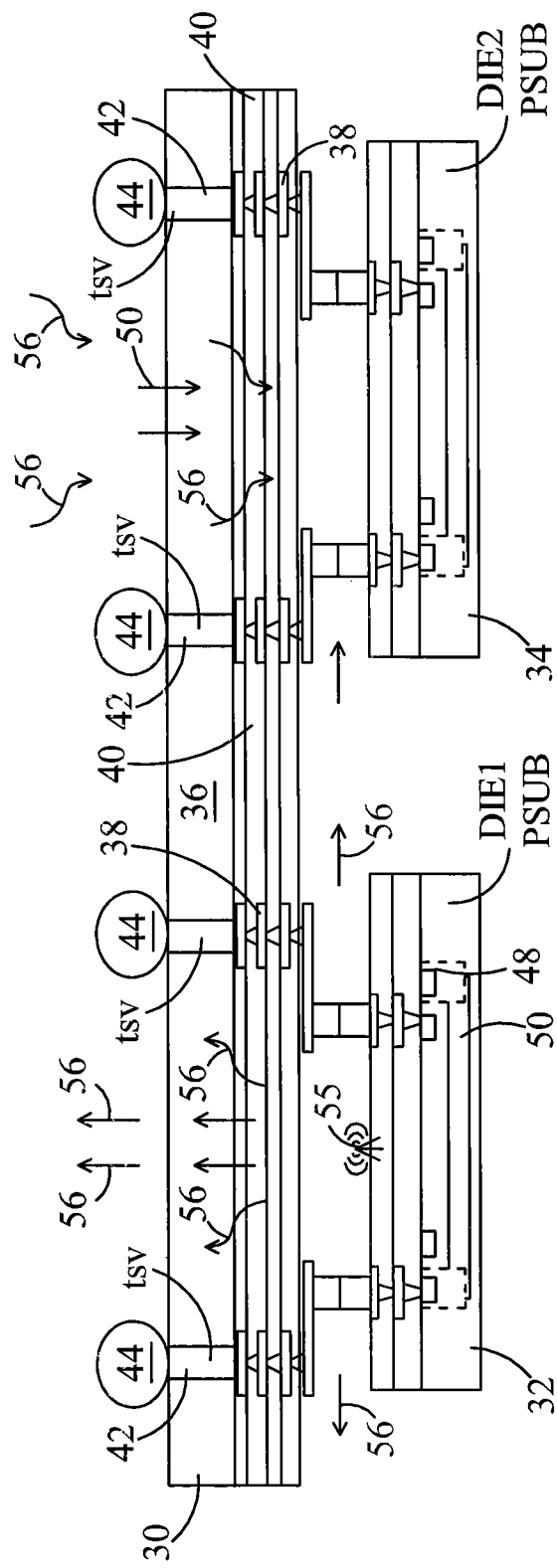
FIG. 2 is a cross-sectional view of an embodiment of two semiconductor die coupled to an interposer.

FIG. 2 is a cross-sectional view showing an arrangement of interposer 30 and two semiconductor die 32 and 34. Interposer 30 is as the previously described interposer 2. Interposer 30 includes substrate body 36 formed of various suitable materials such as but not limited to silicon, glass-silicon and other suitable substrate materials commonly used in the semiconductor art. Interposer 30 also includes multiple conductive layers 38 separated by dielectric layers 40 which are formed of various suitable dielectric materials. Interposer 30 also includes TSVs 42 coupled to conductive layers 38 and solder balls 44 for coupling to further components in various exemplary embodiments. Solder balls 44 have a size of about 200-300 um in one embodiment and a size of about 50-150 um in another embodiment, but are sized differently in other exemplary embodiments. Semiconductor die 32 is formed of suitable substrate material and includes circuitry thereon. Semiconductor die 32 is an integrated circuit in one embodiment but may be any of various other semiconductor devices in various other embodiments. Semiconductor die 32 a P-type substrate that include N-well regions 48 and deep N-well region ("DNW") 50 in the illustrated embodiment, but this is exemplary only. In one embodiment, semiconductor die 32 is a GPS (global positioning sensor) die that sends and receives RF signals and includes in its circuitry EM (electromagnetic) emission source 55. EM emission source 55 is an antenna in one embodiment. In another embodiment, EM emission source 55 is a an RF receiver or an RF transmitter on a GPS (global positioning sensor) chip. In yet another embodiment, EM emission source 55 is an inductor, but EM emission source may be various other circuit elements that create EM emissions in other embodiments.

EM emissions 56 are indicated by arrows that show EM emissions propagating through air and reaching semiconductor die 34. EM emissions 56 may adversely affect circuitry, signals and devices on semiconductor die 34 or other signals or features of interposer 30 or of components coupled to interposer 30. In other embodiments, semiconductor die 32 includes an electrical signal with electronic noise that is coupled to interposer 30 and travels along a conductive lead formed in interposer 30. The electrical signal with electrical noise may emanate from an RF transmitter, RF receiver, antenna, inductor or other noise generating structures.

The disclosure provides embodiments of an interposer such that the interposer and/or the coupling between the interposer and other components of the package, prevents EM emissions and electrical noise from adversely affecting other semiconductor die, i.e. the embodiments isolate the EM emissions and electrical noise, particularly for semiconductor die coupled to the same interposer. According to one embodiment illustrated in FIG. 2, the interposer and/or the coupling between the interposer and other components prevent EM emissions 56 from semiconductor die 32 from adversely affecting semiconductor die 34.

Figure 3A:
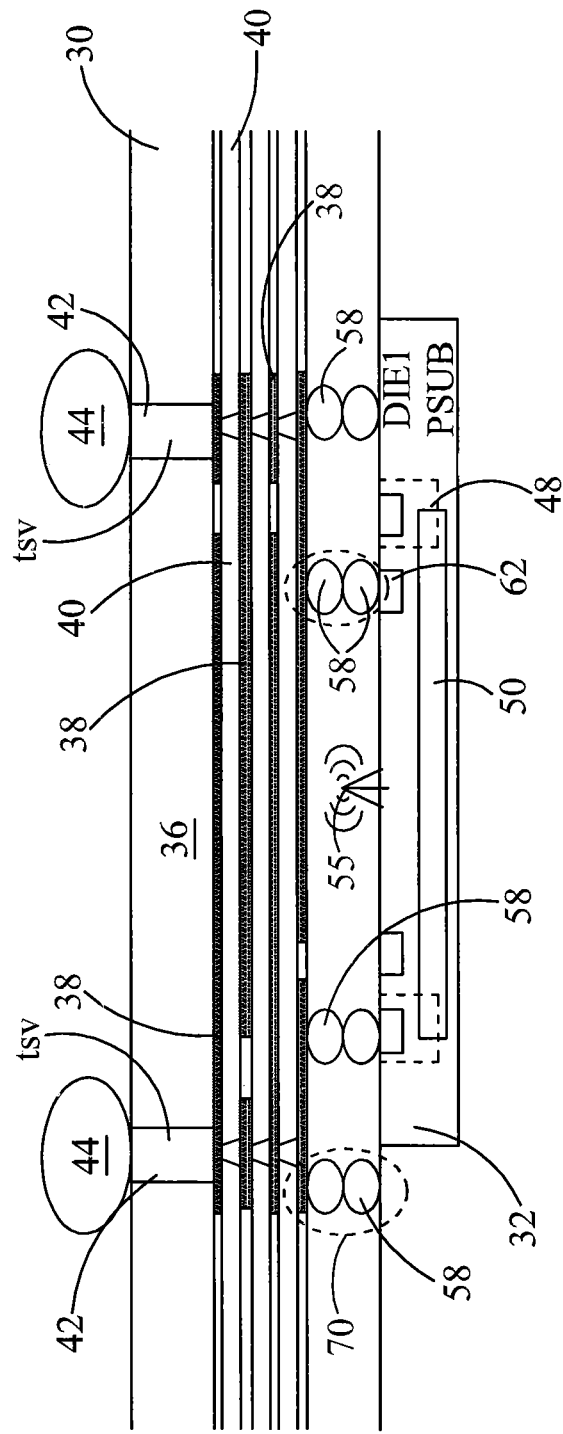
FIGS. 3A and 3B are cross-sectional and plan views, respectively, of one embodiment of an interposer according to the disclosure.
Figure 3B:
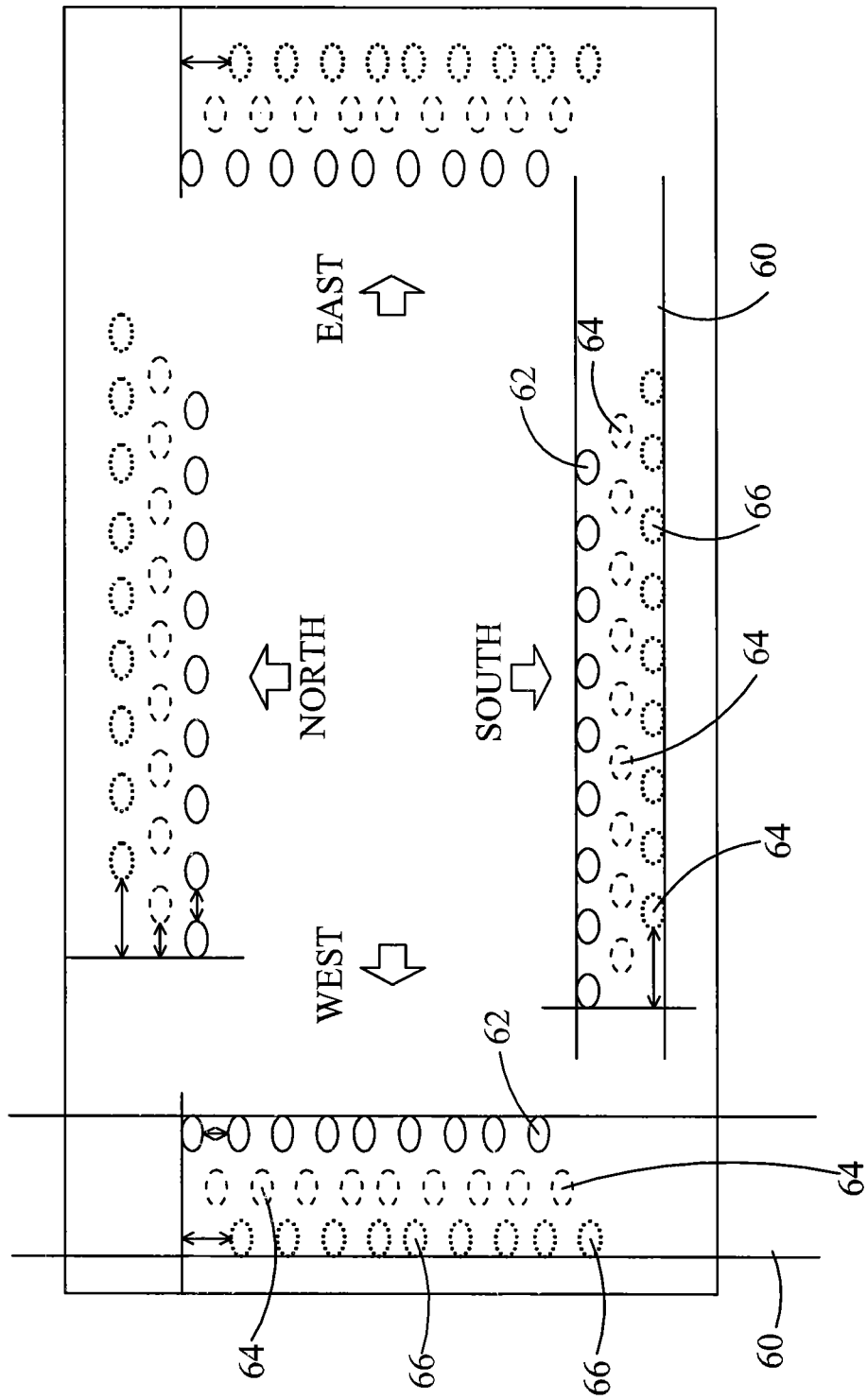

FIGS. 3A and 3B represent cross-sectional and plan views of an interposer embodiment according to the disclosure. Interposer 30 includes substrate body 36 with TSVs 42 and solder balls 44. These features are exemplary only. Interposer 30 also includes multiple conductive layers 38 with dielectric layers 40 between the conductive layers 38. The four conductive layers 38 in the illustrated embodiment are exemplary, and in other embodiments, different numbers of conductive layers may be included. Conductive layers 38 are formed of aluminum in one embodiment and conductive layers 38 are formed of copper in another embodiment. In other exemplary embodiments, conductive layers 38 are formed of alloys of aluminum or copper or various other suitable conductive materials. In other embodiments, conductive layers 38 are formed of semiconductor materials such as polysilicon but are referred to collectively as conductive layers 38. Various suitable dielectric materials used in the semiconductor art are used as dielectric layers 40.

Semiconductor die 32 includes EM emission source 55 which is shown schematically in FIG. 3A and represents an electronic device feature that generates EM emission. EM emission source 55 is an antenna in one embodiment. In another embodiment, EM emission source 55 is an RF receiver or an RF transmitter on a GPS (global positioning sensor) chip. In another embodiment, EM emission source 55 is an inductor, but may be various other circuit elements that create EM emissions in other embodiments. In one embodiment, semiconductor die 32 is a GPS die that receives and transmits radio signals. In another embodiment, semiconductor die 32 is a baseband die. Semiconductor die 32 represents any of various other integrated circuit or other semiconductor devices that have an EM emission source.

Referring to both FIGS. 3A and 3B, semiconductor die 32 is coupled to interposer 30 by strips of rows of solder bumps. FIG. 3B shows four exemplary strips, one each along the outer portions of the north, south, east and west sections of semiconductor die 32.

Each strip 60 includes at least two rows of solder balls joining semiconductor die 32 to interposer 30, and the rows are parallel in the exemplary embodiment of FIG. 3B.

In some embodiments, the strips 60 of solder balls surround the region including EM emission source 55 when semiconductor die 32 is joined to interposer 30.

Strips 60 each include inner row 62 of solder balls. Each strip 60 also includes at least another row of solder balls in addition to inner row 62 in one embodiment. In one embodiment, a second parallel row of solder balls consists of solder balls 64 (indicated by dashed lines in FIG. 3B) and in another embodiment, a second parallel row of solder bumps is indicated by solder balls 66 (indicated by dashed lines in FIG. 3B). In one embodiment, strip 60 includes three parallel rows of solder balls. Each of solder balls 64 and 66 are shown in dashed lines to indicate that either or both of the parallel rows of solder balls may be used in conjunction with parallel row 62 of solder balls.

In the illustrated embodiment of FIG. 3A, inner row 62 of solder balls 58 includes two stacked solder balls 58 and outer row 70 also includes two stacked solder balls 58. This is exemplary. Outer row 70 may be indicative of either of the rows of solder balls 64 and 66 shown in FIG. 3B or of another non-parallel row. In other embodiments, the rows of solder balls may include only a single solder ball joining semiconductor die 32 to interposer 30.

Solder balls 58 are referred to broadly as such, but need not be completely "ball shaped" as in the illustrated embodiment. Solder balls 58 are alternatively described as solder bumps and take on various shapes in various embodiments. Solder balls 58 are formed of any of various suitable solder materials used in the packaging art. In one embodiment, solder balls 58 are round and include a diameter of about 15-30 um but various other sizes are used in other exemplary embodiments. The pitch of the solder balls along the longitudinal direction of strips 60 is 30-60 micro-inches in one embodiment, but various other pitches are used in other exemplary embodiments. In one embodiment, the solder balls of the parallel rows of solder balls are arranged along the longitudinal direction of strip 60 such that an alternating sequence of solder balls from the different rows of solder balls are present along the longitudinal direction. This is exemplary only and other arrangements are used in other exemplary embodiments.

In some embodiments, the solder balls of strips 60 are arranged such that a solder ball is present in strip 60 along all linear locations along the length of strip 60. In some embodiments, strips 60 include an arrangement of solder balls not arranged in a series of rows but such that strip 60 is populated with a solder ball at some point across strip 60, at all linear locations along its length. When semiconductor die 32 is joined to interposer 30, the region surrounding EM emission source 55 has a solder ball positioned between EM emission source 55 and each peripheral location of the region surrounding EM emission source 55, in one embodiment. In some embodiments, not illustrated, strips 60 intersect and completely surround the region including EM emission source 55.

Figure 4A:
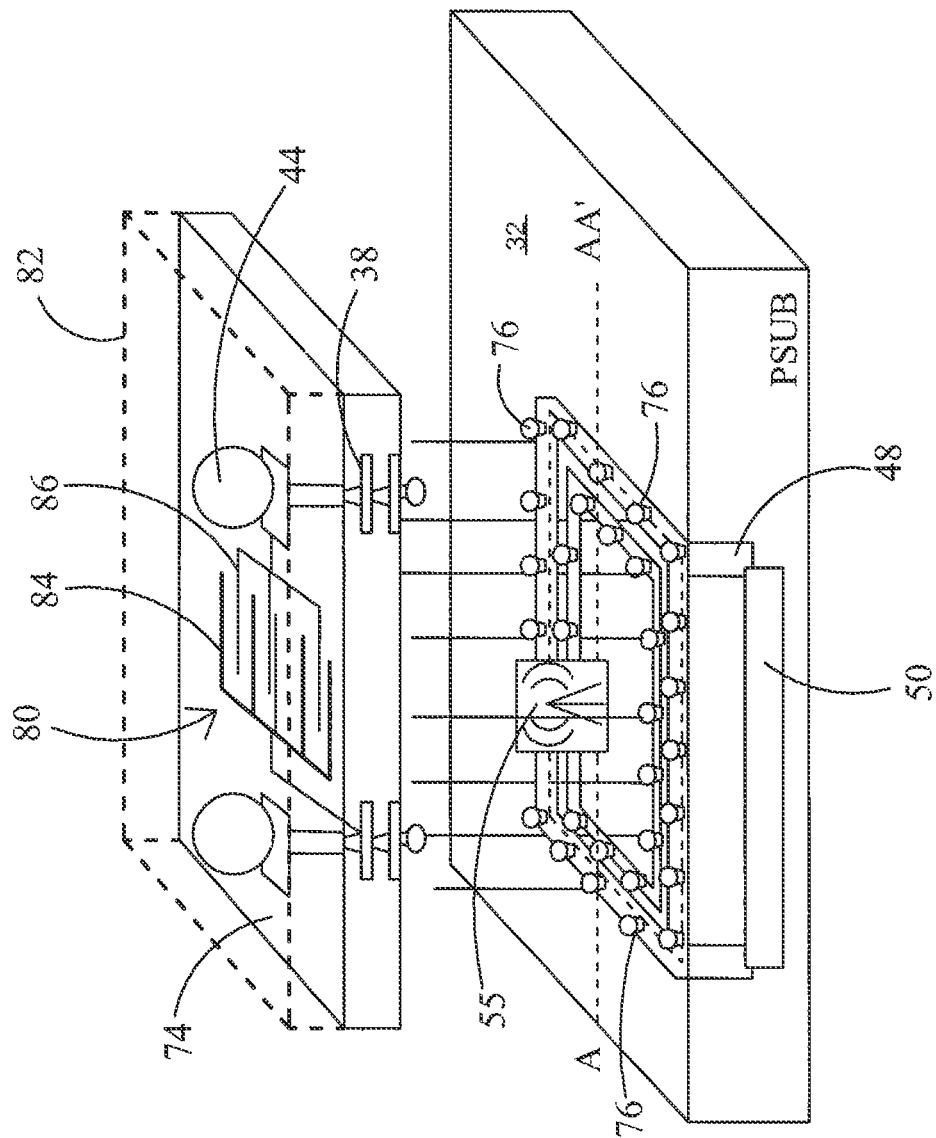
FIGS. 4A, 4B and 4C are each perspective views illustrating an embodiment of an interposer according to the disclosure.
Figure 4B:
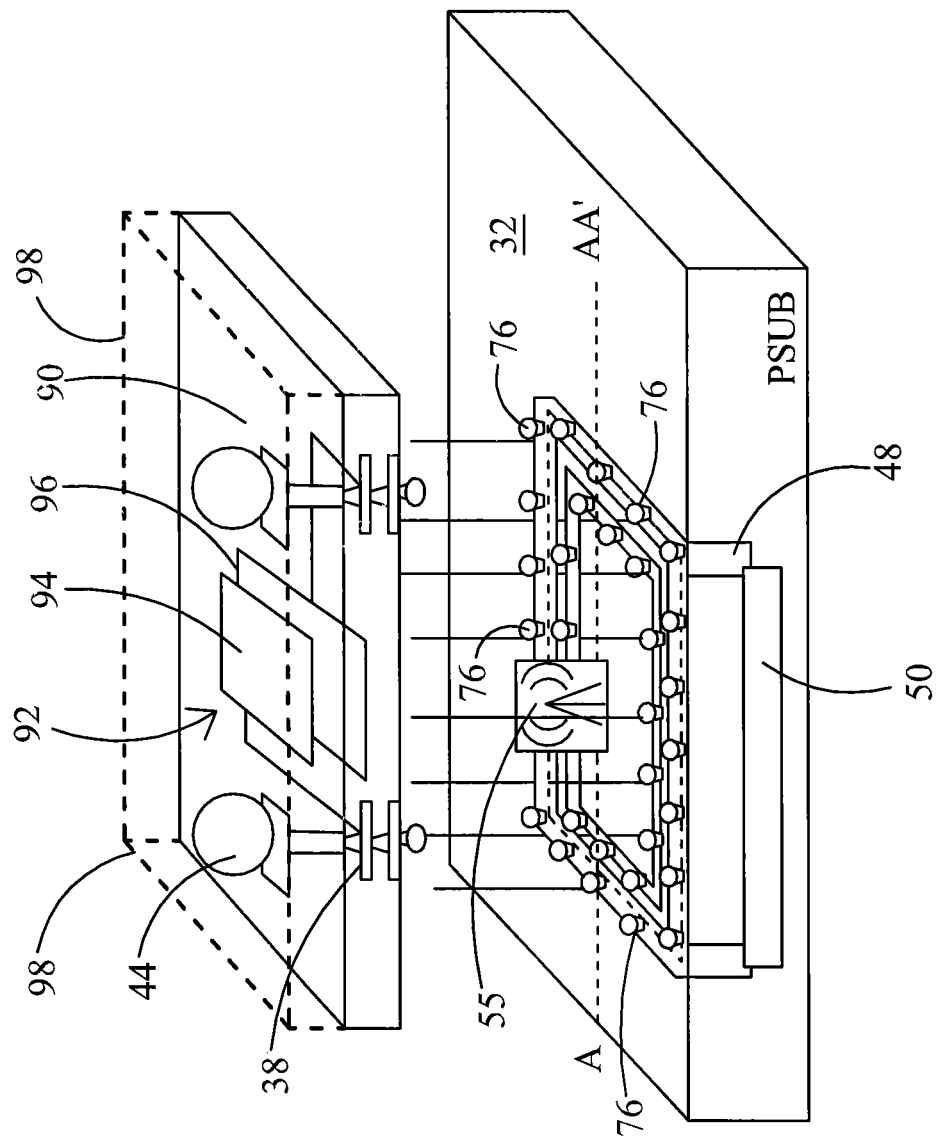
Figure 4C:
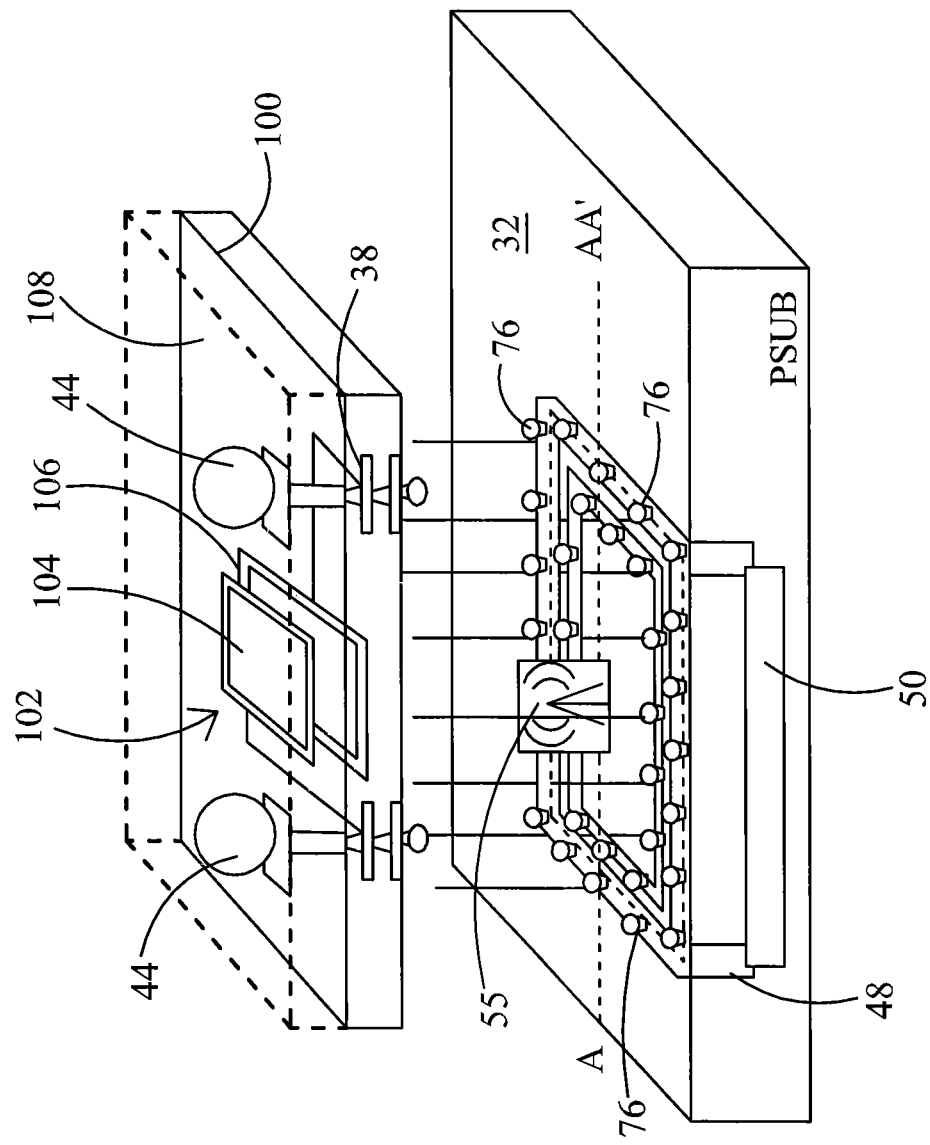

FIGS. 4A-4C illustrate three additional embodiments of an interposer according to the disclosure. Like numbers denote like features throughout the specification and the interposers 74, 90 and 100, illustrated in FIGS. 4A-4C, respectively, may be assembled in a package embodiment such as shown in FIG. 1, for example. Interposers 74, 90 and 100 each include conductive layers 38 isolated from one another by dielectric layers such as described in conjunction with interposer 30, above.

FIG. 4A shows semiconductor die 32 with EM emission source 55. Solder balls 76 are suitably sized and connect semiconductor die 32 to the illustrated portion of interposer 74. The portion of interposer 74 illustrated schematically over semiconductor die 32 is coupled to semiconductor die 32 such that the illustrated portion of interposer 74 is positioned over EM emission source 55. Capacitor 80 is formed within the illustrated portion of interposer 74 and disposed over EM emission source 55 when interposer 74 is joined to semiconductor die 32. Capacitor 80 is a metal-oxide-metal ("MOM") capacitor and serves two purposes in some embodiments. In some embodiments, capacitor 80 is a decoupling capacitor and also provides shielding for electromagnetic emissions emanating from EM emission source 55. In some embodiments, capacitor 80 mitigates power line ripple or otherwise decouples one part from another part of an electrical circuit formed in interposer 74. Capacitor 80 shields EM emission source 55 and prevents electromagnetic interference in other components such as components of interposer 74 (not illustrated) that are formed in dashed portion 82 of interposer 74 and in devices formed on other die or other components coupled to interposer 74. Capacitor 80 includes two electrodes 84 and 86. Each electrode 84 and 86 is a plurality of interconnected parallel digits and the parallel digits of respective plates 84 and 86 are disposed between one another in an alternating fashion in one embodiment. In one embodiment, electrodes 84 and 86 are formed of the same conductive layer of interposer 74. In another embodiment, electrodes 84 and 86 are formed of different conductive layers. According to another embodiment in which electrodes 84 and 86 are formed of different conductive layers, electrodes 84 and 86 are overlaid such that the parallel digits of electrode 84 are perpendicular to the parallel digits of electrode 86.

FIG. 4B shows semiconductor die 32 with EM emission source 55. Solder balls 76 are suitably sized and connect semiconductor die 32 to the illustrated portion of interposer 74. The portion of interposer 90 illustrated schematically over semiconductor die 32 is coupled to semiconductor die 32 such that the illustrated portion of interposer 90 is positioned over EM emission source 55. Capacitor 92 is formed within the illustrated portion of interposer 90 and disposed over EM emission source 55 when interposer 90 is joined to semiconductor die 32. Capacitor 92 is a metal plate capacitor and serves two purposes in some embodiments. In some embodiments, capacitor 92 is a decoupling capacitor and also provides shielding for electromagnetic emissions emanating from EM emission source 55. In some embodiments, capacitor 92 mitigates power line ripple or otherwise decouples other electronic components of interposer 90. Capacitor 92 shields EM emission source 55 and prevents electromagnetic interference in other components such as components of interposer 90 (not illustrated) that are formed in dashed portion 98 of interposer 90 and in devices formed in other die or other components coupled to interposer 90. Capacitor 92 includes two electrodes 94 and 96. Electrodes 94 and 96 are formed of different conductive layers of interposer 90.

FIG. 4C shows semiconductor die 32 with EM emission source 55. Solder balls 76 are suitably sized and connect semiconductor die 32 to the illustrated portion of interposer 100. The portion of interposer 100 illustrated schematically over semiconductor die 32 is coupled to semiconductor die 32 such that the illustrated portion of interposer 100 is positioned over EM emission source 55 when interposer 100 is joined to semiconductor die 32. Capacitor 102 is formed within the illustrated portion of interposer 100 and positioned over EM emission source 55. Capacitor 102 is a metal-insulator-metal ("MIM") or metal-insulator-semiconductor ("MIS") capacitor and serves two purposes in some embodiments. Various dielectrics are used for the capacitor dielectric. In some embodiments, capacitor 102 is a decoupling capacitor for mitigating power line ripple and also provides shielding for electromagnetic emissions emanating from EM emission source 55. Capacitor 102 prevents electromagnetic interference in other components such as components of interposer 100 (not illustrated) that are formed in dashed portion 108 of interposer 100. Capacitor 102 also prevents electromagnetic interference in other components such as other semiconductor die joined to interposer 100. Capacitor 102 includes two electrodes 106 and 104. Electrodes 104 and 106 are formed of different layers of conductive layers 38 of interposer 100. In some embodiments, one of the conductive layers 38 is a semiconductor layer such as polysilicon and serves as capacitor plate 104 or 106.

Figure 5A:
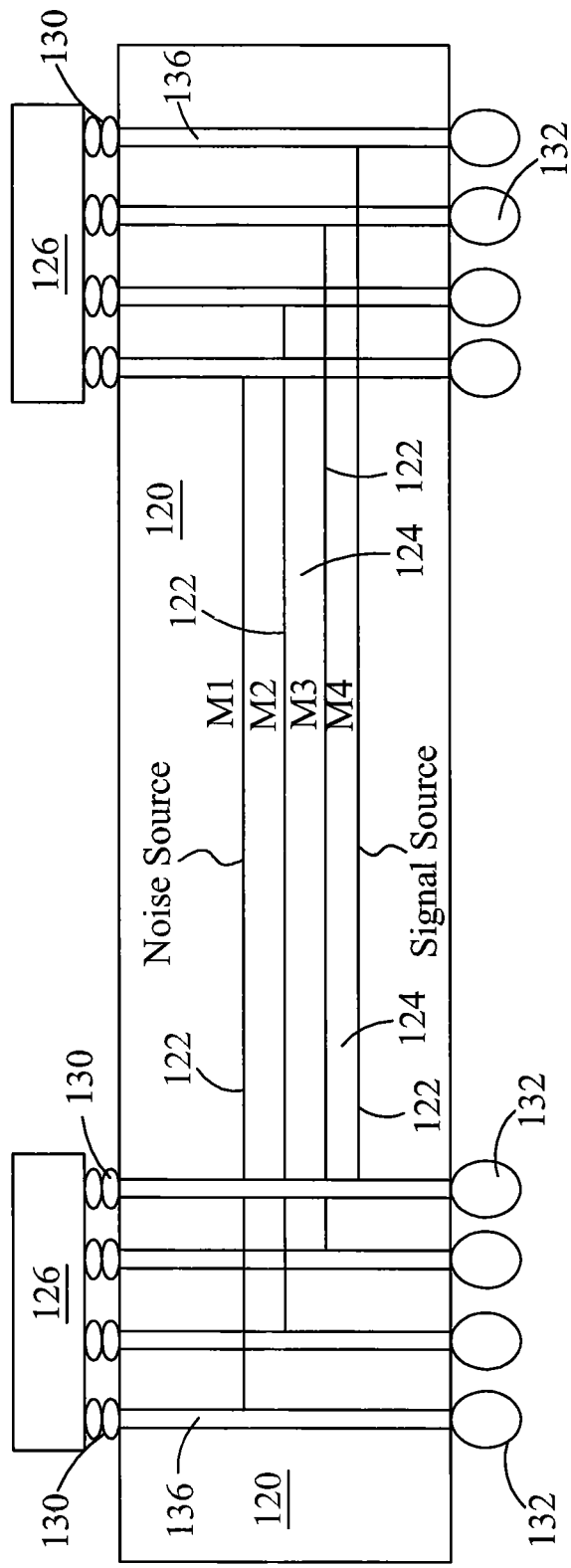
FIGS. 5A and 5B are cross-sectional and plan views, respectively, of an embodiment of an interposer according to the disclosure.
Figure 5B:
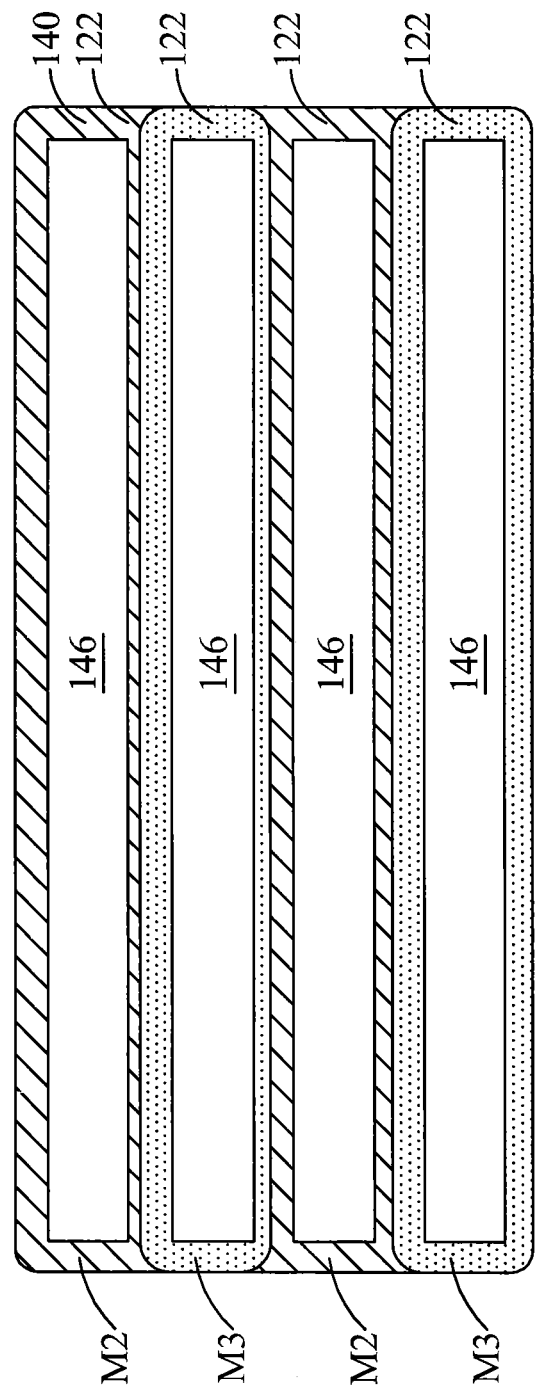

FIGS. 5A and 5B illustrate another interposer embodiment of the disclosure. FIG. 5A is a cross-sectional view of interposer 120. Interposer 120 is formed of various suitable substrate materials and includes conductive layers 122 separated by dielectric material 124. In one embodiment, various suitable metal materials such as aluminum, copper or their alloys, are used for conductive layers 122. Conductive layers 122 are formed of suitable semiconductor material such as polysilicon, in other exemplary embodiments, but are collectively referred to hereinafter simply as conductive layers 122. Conductive layers 122 are also designated "M1," "M2," "M3," and "M4". Interposer 120 is coupled to semiconductor die 126 and 128 by solder bumps 130. Solder bumps 132 couple interposer 120 to other components such as a package substrate or. PCB (not shown). Through-silicon vias ("TSVs") 136 extend completely through interposer 120 in the illustrated embodiment. In one embodiment, semiconductor die 126 is a GPS die that sends and receives RF signals and semiconductor die 128 is a baseband die, but this is intended to be exemplary only. A "Noise Source" is indicated on M1 conductive layer 122 in the illustrated embodiment indicating a noisy electrical signal carried along at least one lead within M1 conductive layer 122. The "Noise Source" lead is coupled to any of various sources of electrical noise such as may be contained in semiconductor die 126 or 128. M4 conductive layer 122 is also identified as "Signal Source" in the illustrated embodiment and represents a signal carried along a lead formed from M4 conductive layer 122 and which is desirably shielded from the electrical noise of the "Noise Source" electrical lead of M1 conductive layer 122, by a shield structure. The shield structure is formed of at least M2 conductive layer 122 and M3 conductive layer 122 such as shown in FIG. 5B. The designation of a lead within M1 conductive layer 122 as "Noise Source" and of a lead within M4 conductive layer 122 as "Signal Source" is exemplary only and in another embodiment, the "Noise Source" is a lead within M4 conductive layer 122 and the "Signal Source" is a lead in M1 conductive layer 122.

Figure 6:
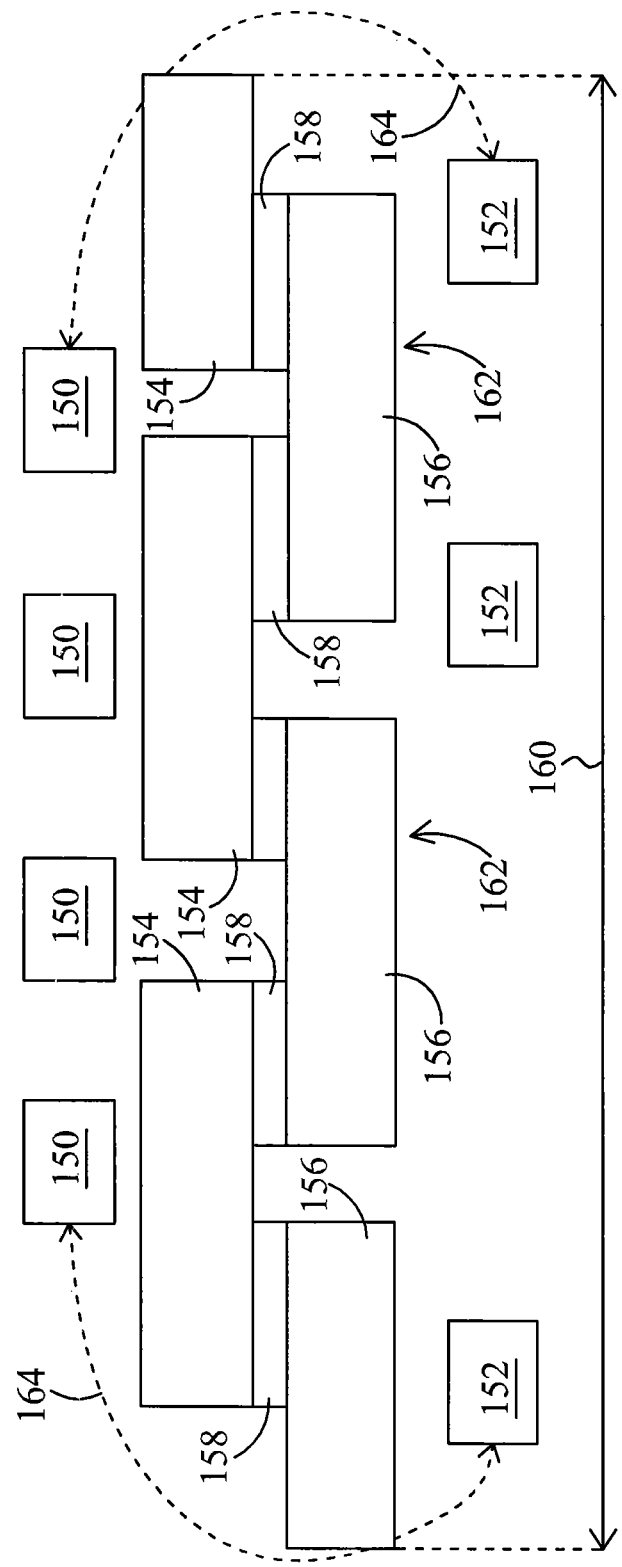
FIG. 6 is a cross-sectional view of an embodiment of an interposer according to the disclosure.

FIG. 5B shows shield 140 formed of portions of M2 conductive layer 122 and portions of M3 conductive layer 122. In the plan view of FIG. 5B, the shield is a continuous shield that extends continuously from top to bottom of the drawing, and shields any noise source above shield 140 from any signal source or other component below shield 140. Either or all of conductive leads 146 that are formed of M1 conductive layer 122 may be a noise source and the noise generated by the noise source is blocked from interfering with a signal source or other components beneath shield 140. Portions of M2 conductive layer 122, which are disposed above M3 conductive layer 122, are coupled to the portions of M3 conductive layer 122 by means of vias, contacts or other connective structures to provide a solid shield such that there is no dielectric path through shield 140. The connective structures are formed of suitable metal or semiconductor materials. An embodiment showing such interconnections is shown in FIG. 6. Still referring to FIG. 5B, shield 140 is formed of materials that absorb or block electrical noise and therefore any electrical noise from a conductive lead 146 carrying a noisy signal would have to go completely around shield 140 to affect a signal being disposed below shield 140, e.g. the Signal Source shown in FIG. 5A.

FIG. 6 is cross-sectional view showing an embodiment of an exemplary shield and illustrates the solid, continuous nature of shield 162, such qualities also applicable to shield 140 shown in FIG. 5B. Shield 162 is included with an interposer according to an embodiment of the disclosure. More particularly, shield 162 is included within dielectric layers formed over a body substrate of an interposer according to an embodiment of the disclosure.

FIG. 6 is a cross-sectional view taken along a direction transverse to the longitudinal direction of interposer, i. e., transverse to the signal carrying direction of the interposer, and shows conductive leads 150 which are formed of an upper conductive layer in one embodiment and extend in and out of the plane of the drawing page. Conductive leads 152 are formed from a subjacent conductive layer. In one embodiment, one or all of conductive leads 150 carries a noisy signal and conductive leads 152 carry another signal desired to be shielded from electrical noise and EM emissions such as may emanate from one or more of conductive leads 150. In another embodiment, the roles of conductive leads 150 and 152 are reversed. Blocking segments 154 and 156 are each formed from a further layer which may be a conductive layer as described above in various embodiments. Blocking segments 154 are coupled to blocking segments 156 by contact structures 158. Contact structures 158 are formed of conductive materials such as metals or semiconductor material in various embodiments.

The lateral dimension 160 of shield 162 formed of blocking segments 154, blocking segments 156 and contact structures 158 is chosen to be sufficiently large such that any noise in the form of EM emission radiation or other electrical noise would have to travel a substantial distance from conductive lead 150 and around shield 162 in order to reach conductive lead 152 and would advantageously become essentially dissipated before reaching conductive lead 152. Shield 162 prevents EM emissions such as EM emissions 164 from travelling through shield 162. In one embodiment, lateral dimension 160 extends substantially completely across the interposer. In some embodiments, lateral dimension 160 represents at least a majority of the width of the interposer that contains shield 162. In one embodiment, lateral dimension 160 is a dimension at least about fifteen to twenty times as great as a width of conductive lead 150. These are exemplary only. It should be understood that lateral dimension 160 of shield 162 is chosen in conjunction with the location of the noisy signals and the signal sources or other components desired to be shielded from noise, such that any EM emissions or other noise from the noisy source would have to travel completely around shield 162 and be substantially dissipated by the time it reaches the signal source of interest. In some embodiments, either or both of blocking segments 154 and 156 are grounded. In one embodiment, lower conductive leads 152 are formed of a lower conductive layer, blocking segments 156 and 154 are formed of intermediate conductive layers, and conductive leads 150 are formed of an upper conductive layer.

Figure 7A:
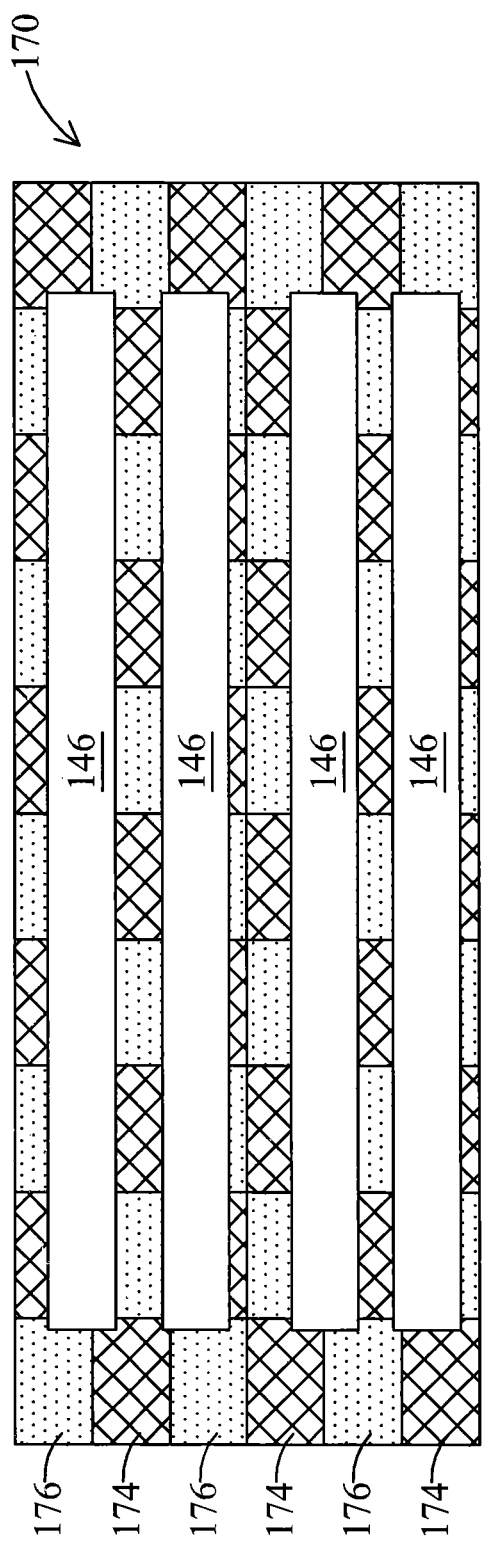
FIGS. 7A and 7B show another embodiment of an interposer according to the disclosure.
Figure 7B:
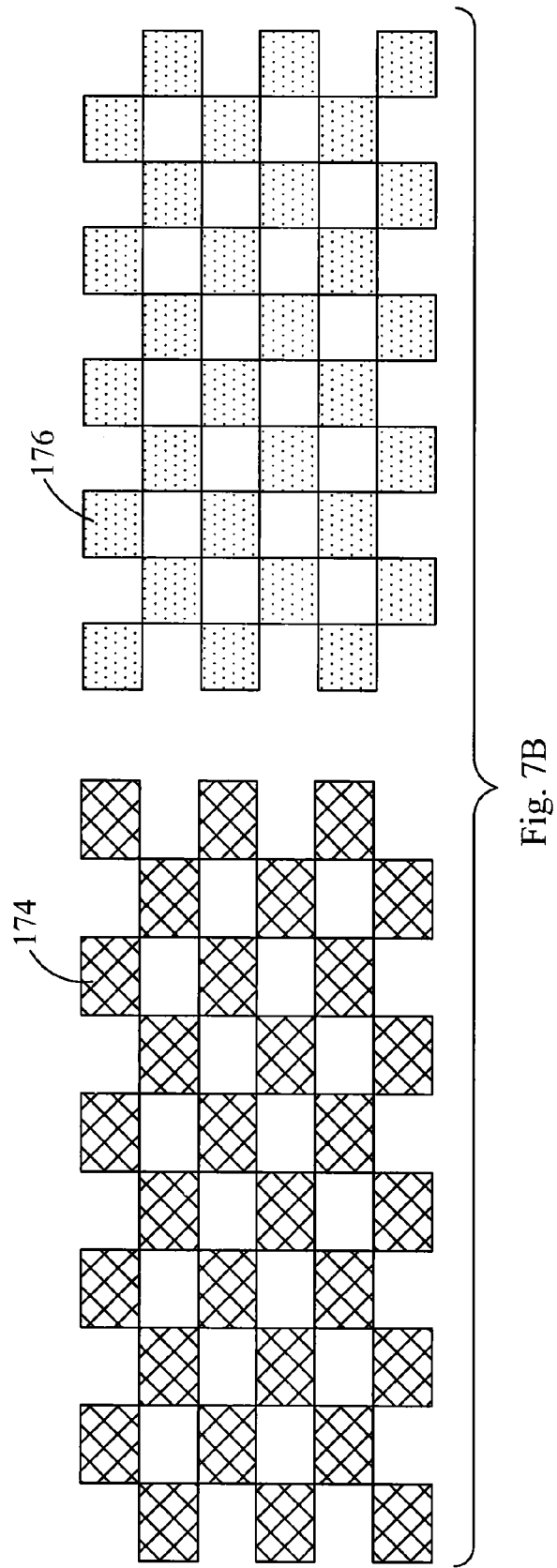

FIGS. 7A and 7B show another embodiment of a shield contained within an interposer according to another embodiment of the disclosure. FIG. 7A is a top view of shield 170 that is disposed beneath conductive leads 146. Conductive leads 146 may be formed of an upper conductive layer such as M1 conductive layer 122 shown in FIG. 5A. In one embodiment, one or all of conductive leads 146 carries a noisy signal and one or more further conductive leads disposed beneath shield 170 carries another signal and is desired to be shielded from electrical noise and EM emissions. Shield 170 is formed of segments of conductive material coupled together. FIG. 7B shows two exemplary checkerboard patterns. Upper checkerboard pattern 174 is formed of a conductive or semiconductor layer and lower checkerboard pattern 176 is also formed of a conductive or semiconductor layer. In one embodiment, upper checkerboard pattern 174 is formed of segments of M2 conductive layer 122 shown in FIG. 5A, lower checkerboard pattern 176 is formed of segments of M3 conductive layer 122 shown in FIG. 5A and conductive leads 146 are formed of portions of M1 conductive layer 122 shown in FIG. 5A. Upper and lower checkerboard patterns 174 and 176 are overlaid to combine to form shield 170 shown in FIG. 7A. When viewed from above, shield 170 is a continuous member formed of a solid uninterrupted pattern formed by the overlaid and interconnected checkerboard patterns. The segments of upper checkerboard pattern 174 are coupled to the segments of lower checkerboard pattern 176 by a series of contacts or vias, not visible in FIG. 7A. Shield 170 is therefore a substantially solid member that prevents noise from a noise source disposed above shield 170 from affecting a signal source disposed below shield 170. Either or all of conductive leads 146 may be a signal source or a noise source. With upper checkerboard pattern 174 coupled to lower checkerboard pattern 176 to form a solid shield 170, there are no dielectric openings that extend through shield 170.

Figure 8:
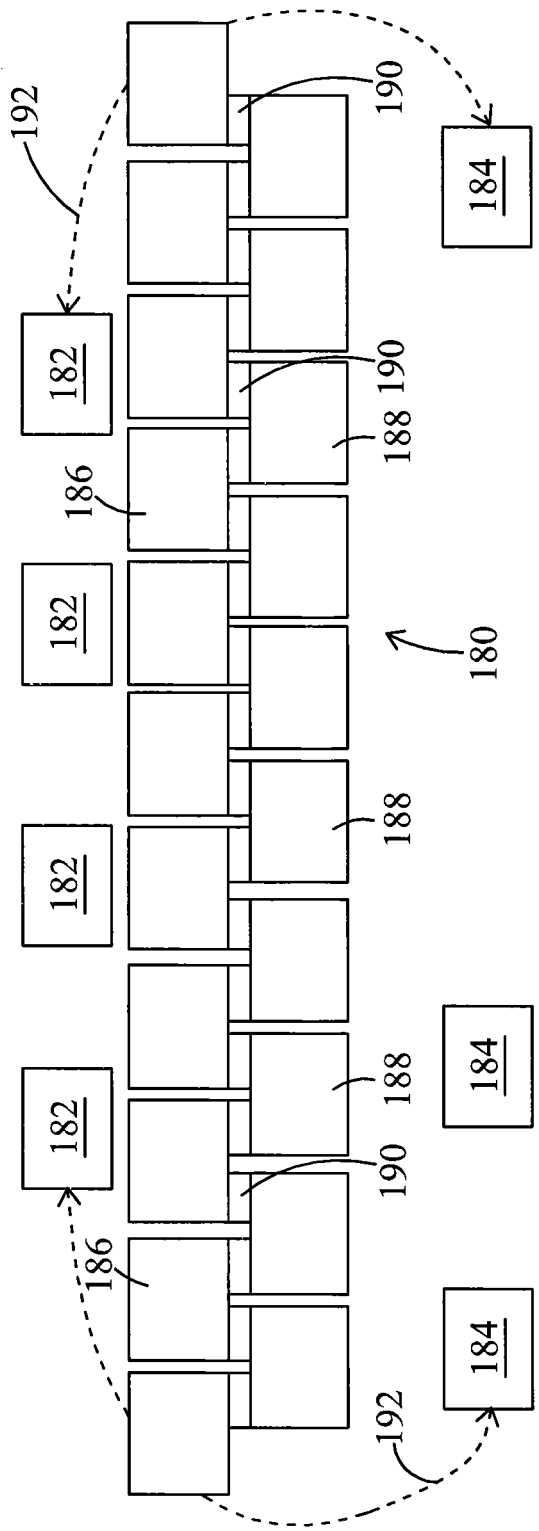
FIG. 8 is a cross-sectional view of an embodiment of an interposer according to the disclosure.

FIG. 8 is a cross-sectional view taken along a direction transverse to the longitudinal direction of an interposer, i. e., transverse to the signal carrying direction of the interposer, and shows conductive leads 182 which are formed of an upper conductive layer in one embodiment. Shield 180 extends along the longitudinal direction of conductive leads 182 and 184 which extend into and out of the plane of the drawing page. Shield 180 is positioned between upper conductive leads 182 and lower conductive leads 184. Shield 180 is formed of segments 186 of an upper layer, segments 188 of a lower layer and contact structures 190 which join upper segments 186 to lower segments 188. Shield 180 is sized to include a dimension suitably large such that any EM emissions or other electrical noise from one of the conductive leads of 182, e.g. EM emissions 192 must travel a significantly long distance and be substantially dissipated before reaching conductive leads 184, or vice versa.

Figure 9:
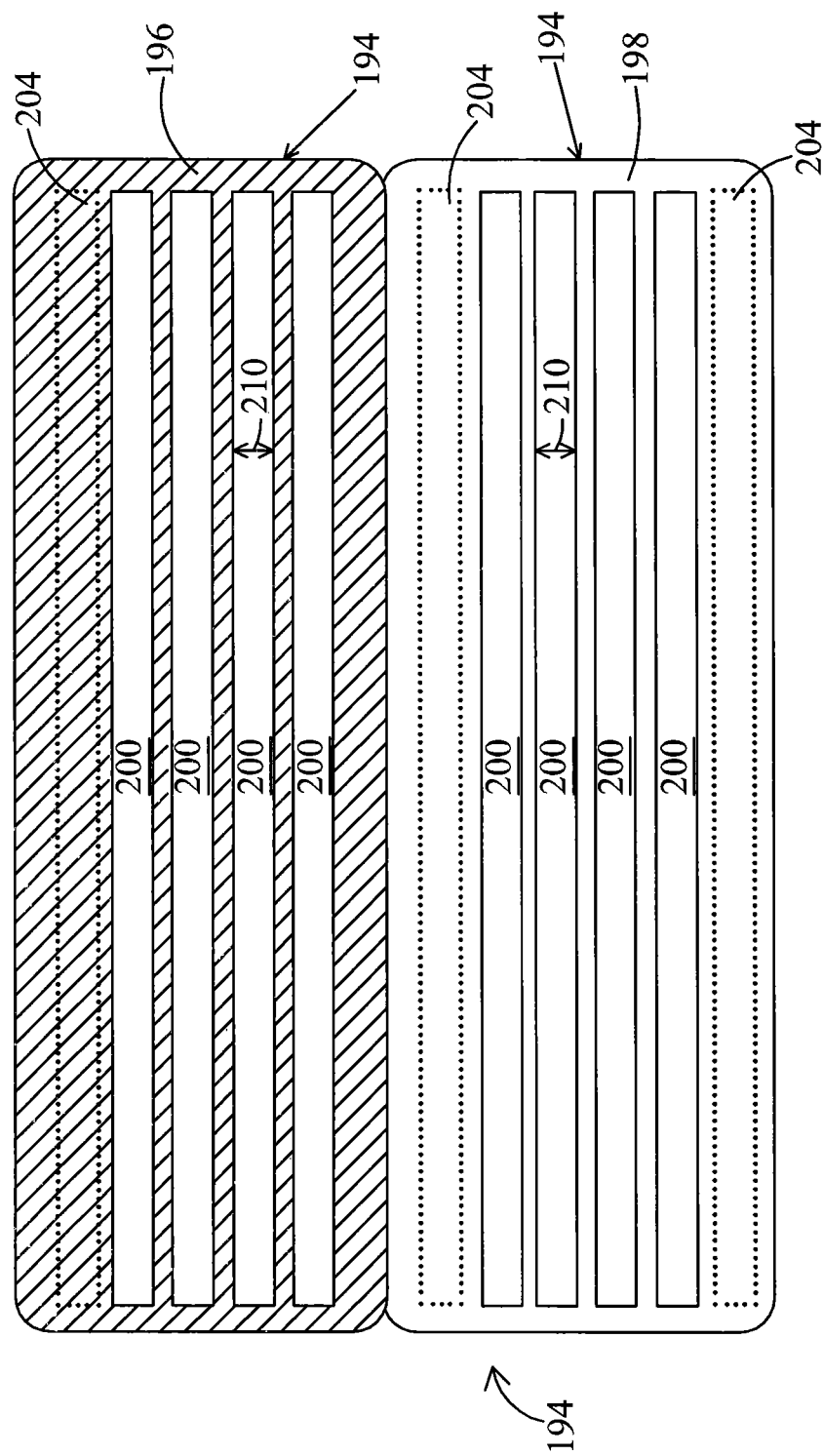
FIG. 9 is a plan view of an embodiment of an interposer according to the disclosure.

FIG. 9 illustrates another embodiment of a shield according to the disclosure. FIG. 9 is a top view that shows shield 194 including blocking portions 196 and 198. Blocking portions 196 and 198 are joined together such that shield 194 is a solid structure. Conductive leads 200 are disposed above shield 194 and further conductive leads disposed beneath shield 194 are designated by dashed lines 204. In one embodiment, one or all of conductive leads 200, which may be disposed above shield 194, carries a noisy signal and further conductive leads disposed beneath shield 194 carry another signal and are desired to be shielded from electrical noise and EM emissions such as from one or more of conductive leads 200. Shield 194 is sized to prevent EM emissions from conductive leads 200 from interfering with signals carried in conductive leads 204. In one embodiment, blocking portions 198 and 200 are formed of two intermediate conductive or semiconductor layers joined together by contacts and/or vias. In one embodiment, shield 194 may be at least fifteen to twenty times as wide as width 210 of conductive leads 200.

Figure 10:
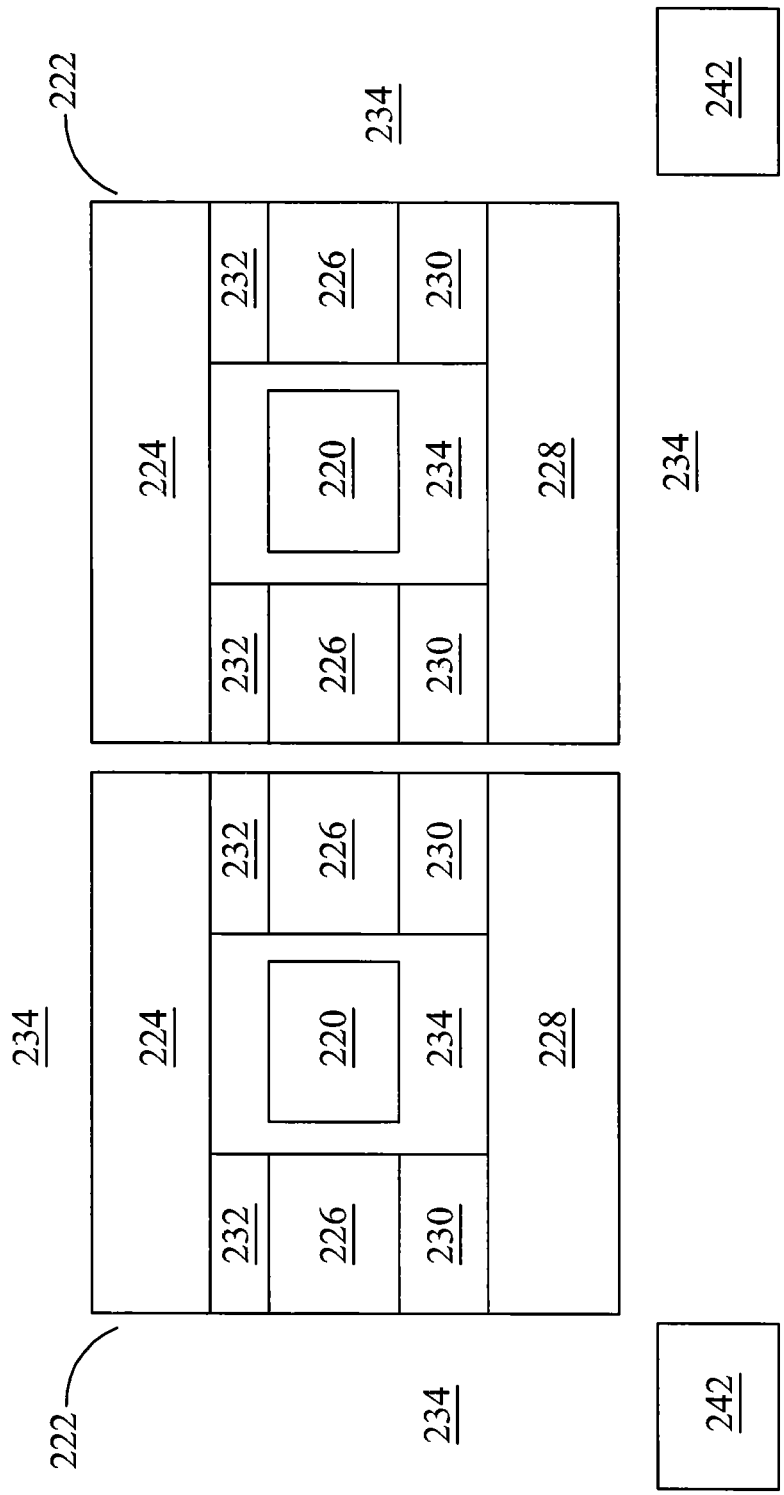
FIG. 10 is a cross-sectional view of an embodiment of an interposer according to the disclosure.

FIG. 10 shows another embodiment of shields formed within an interposer according to the disclosure. More particularly, shields 222 are included within dielectric layers formed over a substrate body of an interposer according to an embodiment of the disclosure. FIG. 10 is a cross-sectional view taken along a direction transverse to the longitudinal direction of an interposer, i.e., transverse to the signal carrying direction of the interposer, and shows conductive leads 220. Shields 222 include upper segments formed of upper layer 224 which is a conductive layer in various embodiments, segments of intermediate layer 226, which is a conductive material in various embodiments, and segments of lower layer 228 which is a conductive layer in various embodiments. As previously defined, conductive layers that include upper layer 224, intermediate layer 226 and lower layer 228 may be formed of suitable metals or semiconductor materials in various exemplary embodiments. The layers are coupled together by contact structures 230 and 232.

Shields 222 are formed within dielectric material 234, which is also present between conductive leads 220 and shields 222, and is disposed over a substrate body. Conductive leads 220 are signal sources, with conductive leads 242 being a source of electrical noise in one embodiment. In another embodiment, conductive leads 242 are signal sources, with conductive leads 220 being noise sources. Shields 222 substantially surround respective conductive leads 220 and shield conductive leads 220 from conductive leads 242 and vice versa. In one embodiment, layers 224, 226, 228 and 242 are successive layers of metals, other conductive materials or semiconductor materials disposed within a dielectric such as dielectric 234 in an interposer. Either or all of conductive layers 224, 226 and 228 are coupled to ground in one embodiment and serve as ground shields.

The structures shown in cross-sections in FIGS. 6, 8 and 10 are exemplary. FIG. 10 illustrates an embodiment in which conductive layers form a shield that completely surrounds a conductive lead such that no dielectric paths exist between the surrounded conductive lead and any electrical noise such as EM emissions that may be present outside the shield, or vice versa. FIGS. 6 and 8 illustrate embodiments with solid continuous shields that include no dielectric openings therethrough. The various shield embodiments of the disclosure utilize various numbers of layers of metal and semiconductor materials. Each of these arrangements is exemplary and various other embodiments include arrangements that combine features of the exemplary shields illustrated, e.g. a surrounding shield such as shield 222 in FIG. 10 may be used in combination with a wide shield such as shield 180 of FIG. 8.

According to one embodiment, an interposer for connecting a semiconductor die to a printed circuit board is provided. The interposer includes a body having opposed first and second surfaces. A facing surface of the semiconductor die is joined to the first surface of the interposer by at least a strip of multiple rows of solder balls that are disposed on, and extend along, the facing surface on outer portions of the semiconductor die.

According to another embodiment, a semiconductor package includes a printed circuit board; a semiconductor die; and an interposer interposed between the printed circuit board and the semiconductor die, the interposer having first and second opposed surfaces. The first surface is coupled to the printed circuit board. A facing surface of the semiconductor die is joined to the second surface of the interposer by at least a strip of parallel rows of solder balls that extend along the facing surface on outer portions of the semiconductor die.

According to another embodiment, an interposer for connecting a semiconductor die to a printed circuit board is provided. The interposer includes a body having opposed first and second surfaces and a plurality of conductive layers therein. The semiconductor die is joined to the first surface of the interposer at a first location, the first location comprising a geometric portion of the interposer that faces the semiconductor die. The interposer includes an internal electromagnetic shield in the first location, the internal electromagnetic shield being a capacitive device formed of the conductive layers.

According to another embodiment, an interposer for connecting a semiconductor die to a printed circuit board is provided. The interposer includes a body having opposed first and second surfaces; a plurality of conductive layers within the interposer, wherein one of the conductive layers includes a first metal lead and a further of the conductive layers includes a second metal lead and the first metal lead is shielded from the second metal lead by a shield including at least one interposed conductive layer of the conductive layers. The first metal lead extends along a longitudinal direction of the interposer and the shield extends continuously laterally across at least a majority of a transverse direction of the interposer between the first and second metal leads. The conductive layers are formed of metal materials or semiconductor materials.

According to another embodiment, an interposer for connecting a semiconductor die to a printed circuit board is provided. The interposer includes a substrate body; a plurality of conductive layers disposed in a dielectric material on the substrate body; a first metal lead; and a shield surrounding the first metal lead, the shield including at least one of semiconductor materials, portions of the conductive layers and further metal portions.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. An interposer for connecting a semiconductor die to a printed circuit board, said interposer comprising:
a body having opposed first and second surfaces and a plurality of conductive layers therein, said semiconductor die joined to said first surface of said interposer that faces said semiconductor die and wherein said semiconductor die includes an emission source disposed on said semiconductor die and said interposer includes an internal electromagnetic shield facing said emission source and being a capacitive device formed of a conductive layer of said plurality of conductive layers disposed inside said interposer,
wherein said interposer includes an electrical circuit therein, said capacitive device is a decoupling capacitor that decouples one part of said electrical circuit from another part of said electrical circuit, wherein said capacitive device comprises a first electrode and a second electrode both formed of a same conductive layer of the interposer, wherein each of the first electrode and the second electrode comprise a plurality of interconnected parallel digits, the plurality of interconnected parallel digits of the first electrode alternatingly horizontally disposed between the plurality of interconnected parallel digits of the second electrode, and wherein said interposer includes an inner group of solder balls arranged peripherally around an area including said electromagnetic shield therein and an outer group of solder balls arranged peripherally around said inner group of solder balls, each of said inner group of solder balls disposed between said first surface and a surface of said semiconductor die that faces said first surface.

2. The interposer as in claim 1, wherein said plurality of conductive layers comprise metal layers and said capacitive device is a metal-insulator-metal (MIM) capacitor with electrodes formed of one of said metal layers.

3. The interposer as in claim 1, wherein said plurality of conductive layers comprise metal layers and said capacitive device is a metal-oxide-metal (MOM) capacitor formed of two capacitor electrodes, each including said plurality of interconnected parallel digits of at least one of said metal layers.

4. An interposer for connecting a semiconductor die to a printed circuit board, said interposer comprising:
a body having opposed first and second surfaces and a plurality of conductive layers therein, said semiconductor die joined to said first surface of said interposer that faces said semiconductor die and wherein said interposer includes an electromagnetic shield that is a capacitive device,
wherein said interposer includes an electrical circuit therein, said capacitive device is a decoupling capacitor that decouples one part of said electrical circuit from another part of said electrical circuit and is a metal-oxide-metal (MOM) capacitor formed of two capacitor electrodes formed of a first metal layer of said plurality of conductive layers, a first of said two capacitor electrodes including a plurality of first parallel leads coupled together and a second of said two capacitor electrodes including a plurality of second parallel leads coupled together, wherein the plurality of first parallel leads and the plurality of second parallel leads are alternatingly horizontally disposed; wherein said two capacitor electrodes are both formed of said first metal layer.

5. An assembly comprising:
a semiconductor die and an interposer for connecting said semiconductor die to a printed circuit board,
said interposer including a body having opposed first and second surfaces and a plurality of metal layers therein, said semiconductor die joined to said first surface of said interposer that faces said semiconductor die and wherein said semiconductor die includes an RF emission source and said interposer includes an electromagnetic shield, said electromagnetic shield being a capacitive device facing said RF emission source,
wherein said capacitive device is a metal-oxide-metal (MOM) capacitor formed of two capacitor electrodes, a first of said two capacitor electrodes formed in a first metal layer of said metal layers and including a plurality of first parallel leads coupled together, and a second of said two capacitor electrodes formed in said first metal layer of said metal layers and including a plurality of second parallel leads coupled together, wherein the plurality of first parallel leads and the plurality of second parallel leads are alternatingly horizontally disposed, and wherein said interposer includes an inner group of solder balls arranged peripherally around an area including said electromagnetic shield therein, and an outer group of solder balls arranged peripherally around said inner group of solder balls, each of said inner group of solder balls disposed between said first surface and a surface of said semiconductor die facing said first surface; and wherein said two capacitor electrodes are both formed of said first metal layer.

6. The assembly as in claim 5, wherein said interposer includes an electrical circuit therein and said capacitive device is a decoupling capacitor that decouples one part of said electrical circuit from another part of said electrical circuit.

7. The interposer as in claim 1, wherein said plurality of conductive layers comprise metal layers and said capacitive device is a metal-oxide-metal (MOM) capacitor formed of said first and second capacitor electrodes, said first capacitor electrode formed of a first metal layer of said metal layers and including a first set of said plurality of parallel digits coupled together and said second capacitor electrode formed of said first metal layer of said metal layers and including a second set of said plurality of parallel digits coupled together.

8. The interposer as in claim 1, wherein said emission source comprises an RF receiver or an RF transmitter and said capacitive device is formed of two capacitor electrodes, each formed of a first conductive layer of said plurality of conductive layers including a plurality of digital leads.

9. The interposer as in claim 4, wherein said plurality of first parallel leads disposed alternatingly between adjacent ones of said second parallel leads.

10. The interposer as in claim 4, wherein said capacitive device shields said electrical circuit from electromagnetic emissions emanating from said electromagnetic emission source.

11. The interposer as in claim 4, wherein said interposer includes an inner group of solder balls arranged peripherally around an area including said capacitive device therein and an outer group of solder balls arranged peripherally around said inner group, each of said solder balls disposed between said first surface and a surface of a semiconductor die that faces said first surface.

* * * * *